United States Patent
Humblet

(10) Patent No.: US 11,483,879 B2
(45) Date of Patent: *Oct. 25, 2022

(54) FORWARD ERROR CORRECTION SYSTEMS AND METHODS

(71) Applicant: Acacia Communications, Inc., Maynard, MA (US)

(72) Inventor: Pierre Humblet, Cambridge, MA (US)

(73) Assignee: Acacia Communications, Inc., Maynard, MA (US)

( * ) Notice: Subject to any disclaimer, the term of this patent is extended or adjusted under 35 U.S.C. 154(b) by 26 days.

This patent is subject to a terminal disclaimer.

(21) Appl. No.: 17/063,447

(22) Filed: Oct. 5, 2020

(65) Prior Publication Data

US 2021/0195659 A1 Jun. 24, 2021

Related U.S. Application Data

(63) Continuation of application No. 16/549,273, filed on Aug. 23, 2019, now Pat. No. 10,798,756, which is a continuation of application No. 16/229,582, filed on Dec. 21, 2018, now Pat. No. 10,440,759, which is a continuation of application No. 15/637,808, filed on Jun. 29, 2017, now Pat. No. 10,201,026.

(60) Provisional application No. 62/394,049, filed on Sep. 13, 2016, provisional application No. 62/356,722, filed on Jun. 30, 2016.

(51) Int. Cl.
*H04W 76/10* (2018.01)
*H04W 72/04* (2009.01)
*H04W 28/20* (2009.01)
*H04L 1/00* (2006.01)
*H03M 13/29* (2006.01)
*H03M 13/11* (2006.01)
*H03M 13/15* (2006.01)

(52) U.S. Cl.
CPC ....... *H04W 76/10* (2018.02); *H03M 13/2921* (2013.01); *H04L 1/00* (2013.01); *H04L 1/0041* (2013.01); *H04L 1/0071* (2013.01); *H04W 28/20* (2013.01); *H04W 72/042* (2013.01); *H03M 13/1102* (2013.01); *H03M 13/152* (2013.01); *H03M 13/1515* (2013.01); *H04W 72/044* (2013.01); *H04W 72/0413* (2013.01); *H04W 72/0453* (2013.01)

(58) Field of Classification Search
CPC . H03M 13/45; H03M 13/2957; H04W 76/10; H04W 28/20; H04W 72/042; H04W 72/0413; H04W 72/044; H04W 72/0453
See application file for complete search history.

*Primary Examiner* — Gary W. Cygiel
(74) *Attorney, Agent, or Firm* — Joseph D'Angelo

(57) ABSTRACT

Techniques for performing forward error correction of data to be transmitted over an optical communications channel. The techniques include: receiving data bits; organizing the data bits into an arrangement having a plurality of blocks organized into rows and columns and into a plurality of strands including a first strand of blocks that includes a back portion comprising a first row of the plurality of blocks, and a front portion comprising blocks from at least two different columns in at least two different rows other than the first row of blocks; and encoding at least some of the data bits in the arrangement using a first error correcting code at least in part by generating first parity bits by applying the first error correcting code to first data bits in the front portion of the first strands and second data bits in the back portion of the first strand.

17 Claims, 8 Drawing Sheets

FORWARD ERROR CORRECTION SYSTEMS AND METHODS

CROSS REFERENCE TO RELATED APPLICATIONS

This application claims the benefit under 35 U.S.C. § 119(e) to U.S. Provisional Application Ser. No. 62/394,049, entitled "FORWARD ERROR CORRECTION SYSTEMS AND METHODS" filed on Sep. 13, 2016, and claims the benefit under 35 U.S.C. § 119(e) to U.S. Provisional Application Ser. No. 62/356,722, entitled "ACACIA FORWARD ERROR CORRECTION CODES" filed on Jun. 30, 2016, each of which is herein incorporated by reference in its entirety.

FIELD

Aspects of the technology described herein relate to using forward error correction techniques for the high-speed transmission of data over optical communication channels.

BACKGROUND

Forward error correction (FEC) is a way of reducing errors in transmission of data over unreliable and/or noisy communication channels. Optical communication systems, for example, use forward error correction to reduce transmission errors. Forward error correction involves encoding data for transmission over a communication channel by adding redundancy to the data. A forward error correction technique may involve: (1) receiving data bits for transmission over a communication channel; (2) encoding the data bits by using an error correcting code (ECC) to generate parity bits from the data bits; and (3) transmitting both the data bits and the parity bits over the communication channel. Since the parity bits are generated from the data bits, transmission of the data bits and parity bits together provides a degree of redundancy in the transmitted information, which in turn allows for recovery from errors that may occur during transmission.

Examples of error correcting codes that may be used, as part of a forward error correction technique, to generate parity bits from data bits include cyclic codes such as Bose, Hocquenghem, and Chaudhuri (BCH) codes and Reed-Solomon codes, turbo codes, product codes (e.g., square binary product codes), block or convolutional low density parity check (LDPC) codes, braided codes, and their derivatives.

SUMMARY

Some embodiments are directed to an apparatus for performing forward error correction of data to be transmitted over an optical communications channel. The apparatus comprises: an input interface; a preprocessor comprising circuitry coupled to the input interface and configured to: organize data bits received from the input interface into an arrangement having a plurality of blocks organized into rows and columns, the plurality of blocks further organized into a plurality of strands of blocks including a first strand of blocks, the first strand of blocks comprising: a back portion comprising a first row of the plurality of blocks, and a front portion comprising blocks from at least two different columns in at least two different rows other than the first row of blocks; and an encoder comprising circuitry configured to encode at least some of the data bits in the arrangement using a first error correcting code at least in part by: accessing first data bits in the front portion of the first strand of blocks; accessing second data bits in the back portion of the first strand of blocks; and generating first parity bits by applying the first error correcting code to the first data bits and the second data bits.

Some embodiments are directed to a method for performing forward error correction of data to be transmitted over an optical communications channel. The method comprises: receiving data bits; organizing the data bits into an arrangement having a plurality of blocks organized into rows and columns, the plurality of blocks further organized into a plurality of strands of blocks including a first strand of blocks, the first strand of blocks comprising: a back portion comprising a first row of the plurality of blocks, and a front portion comprising blocks from at least two different columns in at least two different rows other than the first row of blocks; and encoding at least some of the data bits in the arrangement using a first error correcting code at least in part by: accessing first data bits in the front portion of the first strand of blocks; accessing second data bits in the back portion of the first strand of blocks; and generating first parity bits by applying the first error correcting code to the first data bits and the second data bits.

Some embodiments are directed to an apparatus for performing forward error correction of data to be transmitted over an optical communications channel. The apparatus comprises: an input interface; a preprocessor comprising circuitry coupled to the input interface and configured to organize data bits received from the input interface into an arrangement having a plurality of rows including a first row; and an encoder comprising circuitry configured to encode at least some of the data bits in the arrangement using a first error correcting code at least in part by: generating parity bits for the first row by applying the first error correcting code to a first set of data bits and a second set of data bits, wherein the first set of data bits is arranged in the first row and the second set of data bits is arranged in at least two different columns and in at least two rows in the plurality rows other than the first row, and wherein a first of the at least two different columns includes two or more bits in the second set of data bits.

Some embodiments are directed to a method for performing forward error correction of data to be transmitted over an optical communications channel, the method comprising: receiving data bits; organizing the data bits into an arrangement having a plurality of rows including a first row; and encoding at least some of the data bits in the arrangement using a first error correcting code at least in part by generating parity bits for the first row by applying the first error correcting code to a first set of data bits and a second set of data bits, wherein the first set of data bits is arranged in the first row and the second set of data bits is arranged in at least two different columns and in at least two rows in the plurality rows other than the first row, and wherein a first of the at least two different columns includes two or more bits in the second set of data bits.

Some embodiments are directed to an apparatus for performing forward error correction of data to be transmitted over an optical communications channel. The apparatus comprises: an input interface; a preprocessor comprising circuitry coupled to the input interface and configured to: organize data bits received from the input interface into an arrangement having a plurality of rows including a first row and a second row; and an encoder comprising circuitry configured to encode at least some of the data bits in the arrangement, using a plurality of error correcting codes including a first error correcting code and a second error correcting code different from the first error correcting code, at least in part by: generating first parity bits for the first row by applying the first error correcting code to at least a first set of data bits arranged in the first row; and generating second parity bits for the second row by applying the second error correcting code to at least a second set of data bits arranged in the second row.

Some embodiments are directed to a method for performing forward error correction of data to be transmitted over an optical communications channel. The method comprises: receiving data bits; organizing the data bits into an arrangement having a plurality of rows including a first row and a second row; and encoding at least some of the data bits in the arrangement, using a plurality of error correcting codes including a first error correcting code and a second error correcting code different from the first error correcting code, at least in part by: generating first parity bits for the first row by applying the first error correcting code to at least a first set of data bits arranged in the first row; and generating second parity bits for the second row by applying the second error correcting code to at least a second set of data bits arranged in the second row.

BRIEF DESCRIPTION OF DRAWINGS

Various aspects and embodiments will be described with reference to the following figures. The figures are not necessarily drawn to scale.

DETAILED DESCRIPTION

Figure 1A:
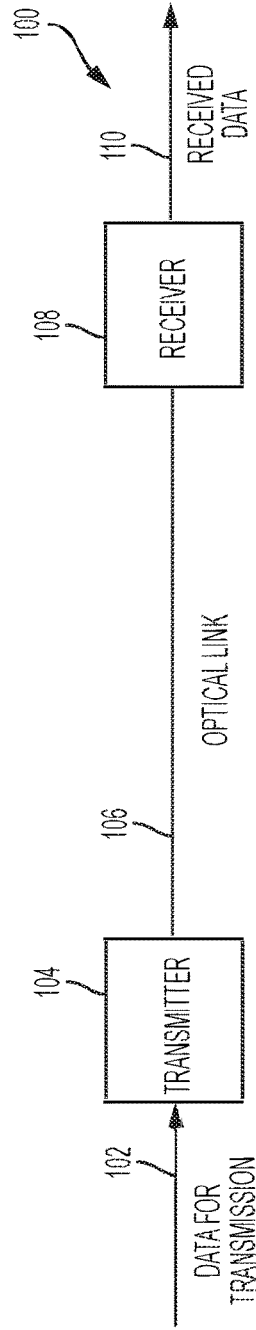
FIG. 1A is a block diagram of an illustrative optical communication system, in which some embodiments of the technology described herein may operate.

The inventor has recognized that conventional forward error correction (FEC) techniques used in optical communication systems may be improved upon. Some conventional FEC techniques used in optical communication systems involve using product codes. However, the performance of product codes is inferior to that of other types of error correcting codes because other types of error correcting codes have lower error rates than the error rates of product codes. Other conventional FEC techniques used in optical communication systems involve using braided codes, which have a lower error rate than product codes. However, standard braided codes are not amenable to an efficient and parallel implementation, which is important in high-speed communication systems, especially those that perform decoding by using an iterative soft decoding scheme.

Accordingly, some embodiments provide for a new class of error correcting codes which are able to achieve a low error rate and which are amenable to an efficient and parallel implementation. For example, the new class of error correcting codes may achieve a lower error rate than that of product codes while providing for a parallel implementation. For example, the codes described herein, having a rate of 0.8, have been observed to have a net coding gain of 0.25 dB above that of a product code with the same rate, when both are decoded using iterative algorithms similar in principles and complexities, in a simulated additive white Gaussian noise channel with BPSK modulation.

The new class of error correcting codes described herein may be used for performing forward error correction in optical communication systems. The low error rate associated with codes in the new class of codes and the ability to implement them efficiently allows for these codes to be used as part of high-speed, high-reliability optical communication systems (e.g., optical communication systems that transfer data at rates of up to 100 Gb/s, 200 Gb/s, 400 Gb/s, 600 Gb/s, 800 Gbs, 1 Tb/s, 2 Tb/s, 5 Tb/s, 10 Tb/s, or any other rate within the range of 100 Gb/s-10 Tb/s with a 1e−15 bit error rate at the FEC decoder output).

It should be appreciated, however, that the new error correcting codes described herein are not limited to being applied to performing forward error correction in optical communication systems and, for example, may be applied to performing forward error correction in any suitable type of communication system(s) and/or to performing error correction in any other suitable setting. The new class of error correcting codes may be referred to herein as "poly-stranded error correcting codes," and a particular error correcting code in the new class of codes may be referred to as a "poly-stranded error correcting code."

Some embodiments described herein address all of the above-described issues that the inventors have recognized with conventional forward error correction techniques. However, not every embodiment described below addresses every one of these issues, and some embodiments may not address any of them. As such, it should be appreciated that embodiments of the technology described herein are not limited to addressing all or any of the above-discussed issues of conventional forward error correction techniques.

In some embodiments, performing forward error correction using a poly-stranded error correcting code may include: (1) receiving data bits for transmission; (2) organizing data bits in an arrangement having a plurality of blocks organized into multiple strands (which strands give the new error correcting code its name of a "poly-stranded" error correcting code); (3) generating parity bits from data bits in each strand using at least one "base" error correcting code (e.g., a cyclic error correcting code or a shortened cyclic error correcting code); (4) and transmitting the data bits and parity bits together. Data bits in different strands may be encoded in parallel such that parity bits may be generated from data bits in one strand concurrently with parity bits being generated from data bits in another strand. Processing data bits in different strands in parallel facilitates high-speed encoding of data, which is important in high-speed optical communication systems.

For example, in some embodiments, performing forward error correction of data to be transmitted over an optical communications channel using a poly-stranded error correcting code may include: (1) receiving data bits to be transmitted over the optical communications channel; (2)

organizing the received data bits into an arrangement having a plurality of blocks organized into rows and columns, the plurality of blocks further organized into a plurality of strands of blocks including a first strand of blocks that includes a back portion comprising a first row of the plurality of blocks, and a front portion comprising blocks from at least two different columns in at least two different rows other than the first row of blocks; (3) encoding at least some of the data bits in the arrangement using a first error correcting code at least in part by: accessing first data hits in the front portion of the first strand of blocks; accessing second data bits in the back portion of the first strand of blocks; and generating first parity bits by applying the first error correcting code to the first data bits and the second data bits; and (4) transmitting the data bits and generated parity bits over the optical communication channel. Aspects of the arrangement are described in further detail below including with reference to FIGS. 3A-3D.

As another example, in some embodiments, performing forward error correction of data to be transmitted over an optical communications channel using a poly-stranded error correcting code may include: (1) receiving data bits to be transmitted over an optical communications channel; (2) organizing the received data bits into an arrangement having a plurality of rows including a first row; (3) encoding at least some of the data hits in the arrangement using a first error correcting code at least in part by generating parity bits for the first row by applying the first error correcting code to a first set of data bits and a second set of data bits, wherein the first set of data bits is arranged in the first row and the second set of data bits is arranged in at least two different columns and in at least two rows in the plurality rows other than the first row, and wherein a first of the at least two different columns includes two or more hits in the second set of data bits; and (4) transmitting the data hits and the parity bits over the optical communications channel.

Additionally, in some embodiments, the structure of the arrangement into which the received data bits are organized allows for the encoding of data bits in different strands (and/or data bits in different portions of the same strand) to be encoded using different error correction codes. In some embodiments, for example, data bits in two different portions of the same strand (or in two different strands) may be encoded, respectively, using a first error correcting code (e.g., a BCH code or a shortened BCH code) associated with a first binary parity check matrix and a second error correcting code associated with a second binary parity check matrix that is a row permutation of the first binary parity check matrix. In other embodiments, data bits in two different portions of the same strand (or data bits in two different strands) may be encoded using any two different error correcting codes or using the same error correcting code, as aspects of the technology described herein are not limited in this respect.

For example, in some embodiments, performing forward error correction of data to be transmitted over an optical communications channel using a poly-stranded error correcting code may include: (1) receiving data bits to be transmitted over an optical communications channel; (2) organizing the received data bits into an arrangement having a plurality of rows including a first row and a second row; (3) encoding at least some of the data hits in the arrangement, using a plurality of error correcting codes including a first error correcting code and a second error correcting code different from the first error correcting code, at least in part by: (a) generating first parity bits for the first row by applying the first error correcting code to at least a first set of data bits arranged in the first row; and (b) generating second parity bits for the second row by applying the second error correcting code to at least a second set of data bits arranged in the second row; and (4) transmitting the data bits and the generated parity bits over the optical communications channel.

Following below are more detailed descriptions of various concepts related to, and some embodiments of, the novel forward error correction techniques developed by the inventor. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

FIG. 1A is a block diagram of an illustrative optical communication system 100 in which some embodiments of the technology described herein may operate. Optical communication system 100 may be configured to transmit data at a high-speed. For example, optical communication system 100 may be configured to transfer data at rates of up to 100 Gb/s, 200 Gb/s, 400 Gb/s, 600 Gb/s, 800 Gbs, 1 Tb/s, 2 Tb/s, 5 Tb/s, 10 Tb/s or any rate between 100 Gb/s and 10 Tb/s, in some embodiments.

Optical communication system 100 comprises a transmitter 104 configured to: (1) receive data for transmission 102; (2) use forward error correction to encode the data 102 to obtain encoded data; and (3) transmit the encoded data (e.g., by using an appropriate modulation scheme) over optical link 106. The transmitter 104 may perform forward error correction coding in any suitable way and, in some embodiments, may perform forward error correction using a poly-stranded code, in accordance with some embodiments of the technology described herein.

Optical communication system 100 further comprises a receiver 106 configured to: (1) receive data over optical link 106 (e.g., at least in part by demodulating the transmitted data); (2) decode the encoded data to obtain data 110; and (3) output the decoded data 110.

Figure 1B:
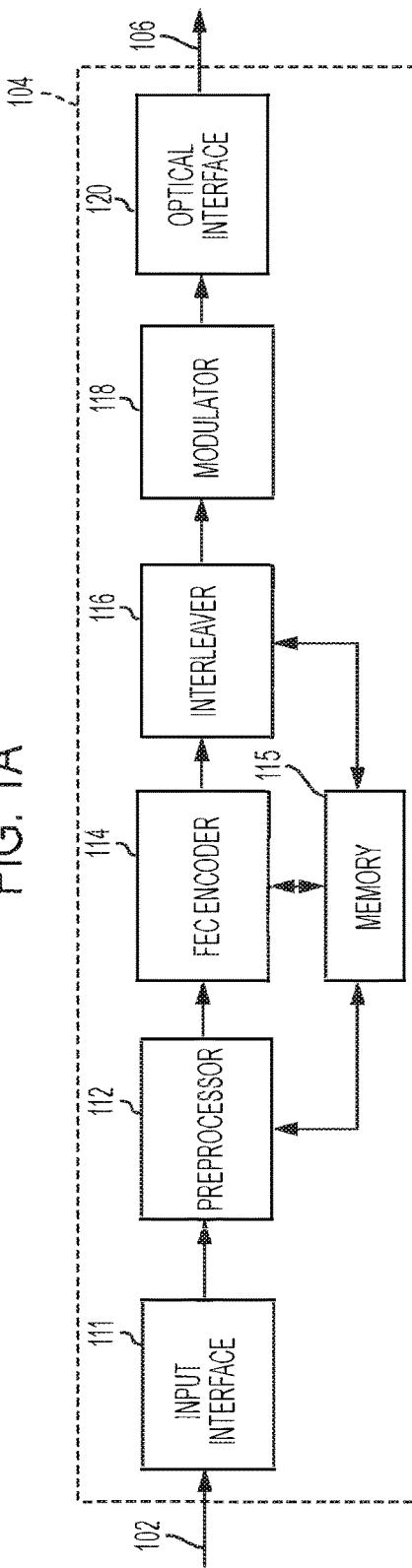
FIG. 1B is a block diagram of an illustrative transmitter in the illustrative optical communication system of FIG. 1A.

FIG. 1B is a block diagram illustrating components of example transmitter 104 of optical communication system 100. As shown, transmitter 104 comprises input interface 111 preprocessor circuitry 112, forward error correction encoder circuitry 114, memory 115, interleaver circuitry 116, modulator circuitry 118, and optical interface 120. The input interface 111 is configured to receive data for transmission by transmitter 104. The data for transmission may be obtained from any suitable source(s).

In some embodiments, the preprocessor circuitry 112 is configured to organize data received, via input interface 111, into an arrangement stored in memory 115. In some embodiments, the input interface 111 may comprise circuitry configured to operate as a de-framer by accessing data arriving in a sequence of frames (e.g., a sequence of data frames structured according to a transport protocol such as the optical transport protocol), while discarding header information. The preprocessor circuitry 112 may be configured to organize data into the arrangement, by storing data hits into portions of memory 115 corresponding with rows of the arrangement. In turn, the arrangement and/or other data stored in memory 115 may be used by FEC encoder circuitry 114 to encode data received via input interface 111 using a poly-stranded code, in accordance with the techniques described herein.

In some embodiments, the FEC encoder circuitry 114 is configured to encode at least some of the data bits stored in memory 115 by generating parity bits from the data bits by using a poly-stranded error correcting code, as described herein. The FEC encoder circuitry 114 may write the generated data bits into the arrangement stored in memory 115.

In some embodiments, the interleaver circuitry 116 is configured to access data bits and parity bits in memory 115 and rearrange them (e.g., relative to the order in which the data bits are received over input interface 111 and/or stored in memory 115) so as to improve the performance of the communication system with regard to burst errors. The interleaver circuitry 116 may be configured to interleave the data to be transmitted (e.g., the data bits and the parity bits) in any suitable way, as aspects of the technology described herein are not limited in this respect.

In some embodiments, the modulator circuitry 118 may receive data from an output of the interleaver circuitry 116 and modulate the data for transmission over optical link 106. The modulator circuitry 118 may comprise circuitry configured to modulate the data using binary phase shift keying (BPSQ), quadrature phase shift keying (QPSK), differential phase shift keying (DPSK), or any other suitable modulation scheme, as aspects of the technology described herein are not limited to being used with a particular choice of modulation scheme. The modulated data is then provided to output interface 120 for transmission over optical link 106.

It should be appreciated that the embodiment of a transmitter 104 shown in FIG. 1B is illustrative and there are variations. For example, in the illustrated embodiment of FIG. 1B, the transmitter includes a preprocessor 112 configured to organize data received, via input interface 111, into an arrangement stored in memory 115. In turn, FEC encoder 114 is configured to accesses data bits stored in memory 115 and encodes them. In other embodiments, however, transmitter 104 may not include a preprocessor. In such embodiments, the FEC encoder 114 may be configured to: (1) receive data from the input interface 111; (2) encode data bits received from the input interface to generate parity bits; and (3) store the received data bits and the generated parity bits into portions of memory 115 corresponding with rows of the arrangement.

Figure 1C:
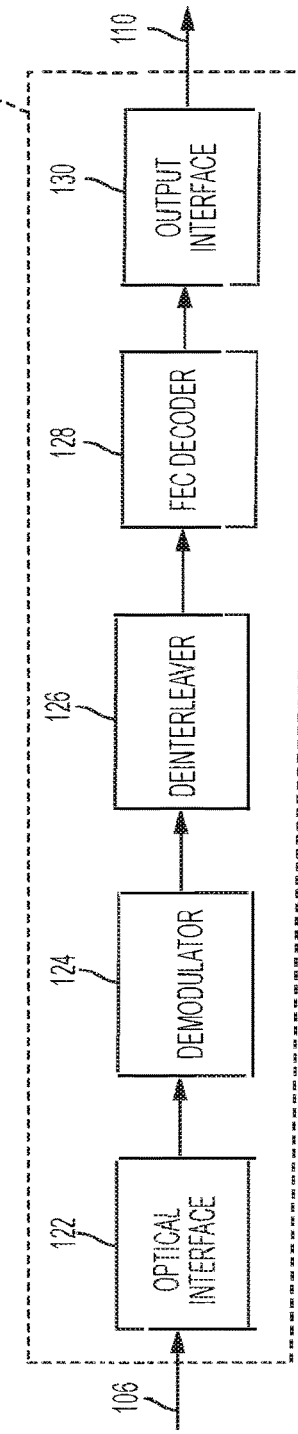
FIG. 1C is a block diagram of an illustrative receiver in the illustrative optical communication system of FIG. 1A.

FIG. 1C is a block diagram illustrating components of example receiver 106 of optical communication system 100. As shown, receiver 106 comprises optical interface 122, demodulator circuitry 124, deinterleaver circuitry 126, FEC decoder circuitry 128, and output interface 130. Optical interface 122 is configured to receive data transmitted over optical link 106. The demodulator circuitry 124 is configured to demodulate data received over optical link 106. The demodulated data is provided to deinterleaver circuitry 126, which is configured to reverse or undo the re-arrangement of the data performed by the interleaver 116. The FEC decoder circuitry 128 is configured to decode the de-interleaved data and provide the decoded data to output interface 130.

In some embodiments, the FEC decoder circuitry 128 may configured to perform hard-decision decoding, while in other embodiments, the FEC decoder may be configured to perform soft-decision decoding, with one or multiple iterations, to decode the data received over link 106. Iterative hard-decision decoding may be performed using any suitable iterative hard-decision decoding technique that may be used for decoding product codes, as aspects of the technology described herein are not limited in this respect. Similarly, iterative soft-decision decoding may be performed using any suitable iterative soft-decision decoding technique that may be used for decoding product codes, as aspects of the technology described herein are not limited in this respect.

Any of the circuitry described with reference to FIGS. 1A, 1B, and 1C (e.g., input interface 111, preprocessor circuitry 112, FEC encoder circuitry 114, and FEC decoder circuitry 128) may be implemented as an application specific integrated circuit (ASIC), a field programmable gate array (FPGA), a combination of logic circuits, a microcontroller, or a microprocessor.

Although, FIGS. 1A, 1B, and 1C illustrate an optical communication system in which some embodiments of the technology described herein may operate, it should be appreciated that the forward error correction techniques described herein may be used in any other suitable type of communication system, as aspects of the technology described herein are not limited in this respect.

As described above, some conventional FEC techniques applied to optical systems utilize binary product codes. Using a square binary product code is described in more detail below with reference to FIG. 2 in order to provide some context and to highlight structural differences between binary product codes and the poly-stranded codes described herein.

Figure 2:
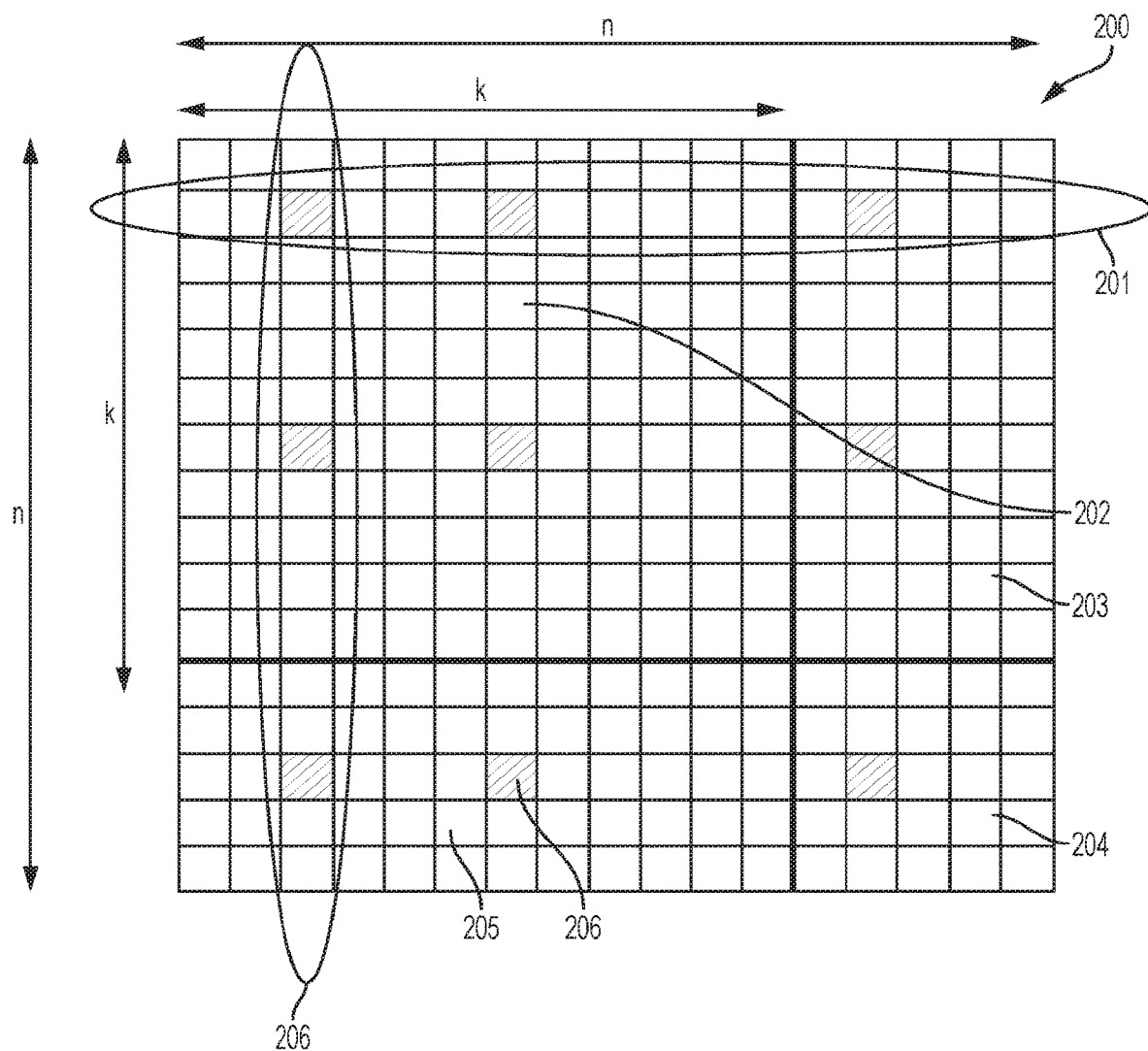
FIG. 2 is an illustrative diagram of a block for storing data bits, generating parity bits from the data bits using a square binary product code, and storing the generated parity bits.

FIG. 2 is an illustrative diagram of a block 200 for storing data bits, generating parity bits from the data bits using a square binary product code, and storing the generated parity bits. The manner in which the data bits are stored in block 200 impacts the way in which the parity bits are generated from the data bits.

The block 200 is an n×n square matrix of bits comprising four portions: a portion 202 having k×k data bits, portion 203 having k×(n−k) parity bits, portion 205 having (n−k)×k parity bits, and portion 204 having (n−k)×(n−k) parity bits. To encode data bits using the square binary product code, the portion 202 is first filled with $k^2$ data bits to be transmitted over an (e.g., optical) communication channel.

Next, the data bits in portion 202 are encoded one row at a time. In particular, for each row of data bits in portion 202, a corresponding set of parity bits is generated using a base error correcting code and stored into portion 203. For example, the data bits stored in the portion of row 201 that intersects with portion 202 of block 200 are used to generate parity bits that are subsequently stored in the portion of row 201 that intersects with portion 203 of block 200. After this row-encoding step, a k×n portion of the block 200 has been filled with a combination of data bits and parity bits. In some embodiments, at least some of the rows may be encoded in parallel.

Next, the data bits in portion 202 and the parity bits in portion 203 are encoded one column at a time. In particular, for each column of data bits in portion 202 and each column of parity bits in portion 203, a corresponding set of parity bits is generated using a base error correcting code and stored into portion 205 or portion 204. For example, the data bits stored in the portion of column 206 that intersects with portion 202 of block 200 are used to generate parity bits that are subsequently stored in the portion of column 206 that intersects with portion 205 of block 200. After this column-encoding step, the entire block 200 has been filled with a combination of data bits and parity bits. In some embodiments, at least some of the columns may be encoded in parallel.

The base error correcting code used as part of a square binary product code to encode data bits may be an extended BCH code (which can be shortened) or any other suitable linear binary block code. The base error correcting code is associated with an n×(n−k) parity check matrix H, and using the base error correcting code to generate (n−k) parity bits from k data bits involves placing the k data bits into an 1×n vector x and determining the parity bits by determining the values in the positions of x such that the matrix equation xH=0 is satisfied.

The base error correcting code may have minimum distance $d_{min}$ and each non-zero base codeword then has at least weight $d_{min}$. In FIG. 2, the shaded squares 206 represent 1 bits. That figure shows that if any pair of row code and column code have minimum weight $d_{min}$=3, then the product codeword will have weight $d_{min}^2$=9, which is also the minimum weight of the product code. Poly-stranded codes turn out to be have more favorable properties.

FIGS. 3A-3D are diagrams illustrating an example arrangement 300 used to perform forward error correction using a poly-stranded error correcting code, in accordance with some embodiments of the technology described herein. Data bits for transmission over an (e.g., optical) communication channel may be received and organized in (e.g., stored in specific portions of) the arrangement 300. Parity bits may be generated from the data bits stored in the arrangement 300 by using one or more base error correcting codes associated with the poly-stranded error correcting code. After the parity bits are generated, they may be stored in the arrangement 300 and may be used to generate parity bits for other data bits stored in the arrangement. The data bits and parity bits stored in the arrangement 300 may be read and transmitted, by an optical or any other suitable type of communication system, over an optical or any other suitable type of communication channel.

Figure 3A:
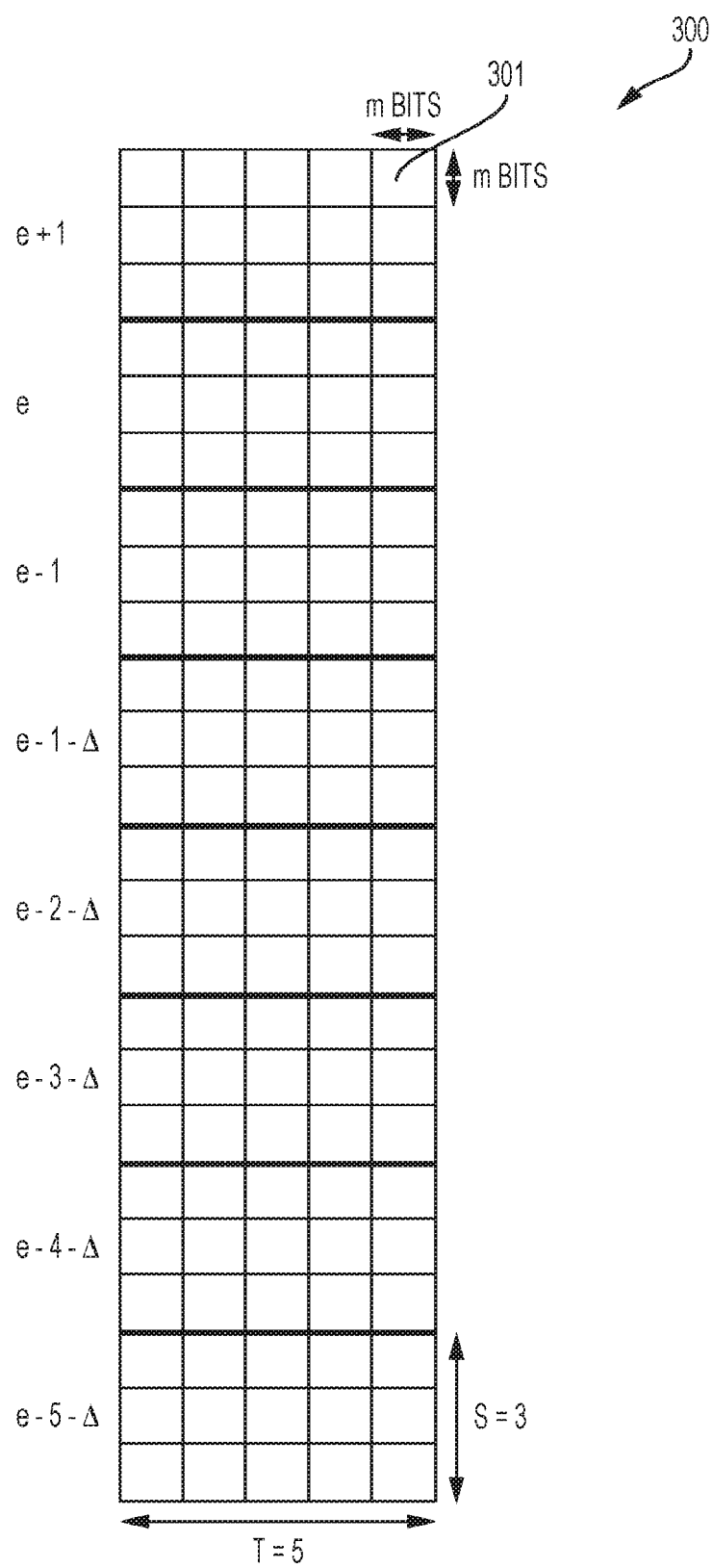
FIGS. 3A-3D are diagrams illustrating an example arrangement used by a poly-stranded code for storing data bits, generating parity bits, and storing the generated parity bits, in accordance with some embodiments of the technology described herein.

As shown in FIG. 3A, the arrangement 300 stores data in a plurality of blocks organized in rows and columns. Each of the plurality of blocks is an m×m block of bits, where m is any positive integer. For example, block 301 is an m×m block having $m^2$ bits. In some embodiments, the width of the memory used to store arrangement 300 may be $m^2$ bits such that all $m^2$ bits may be stored at the same memory address. The number in of rows of bits in a block of bits may be selected in any suitable way and, for example, may be selected based on a width of memory used to store arrangement 300 and/or based on a width of circuitry (e.g., a bus) used to read/write bits from/to arrangement 300.

In some embodiments, each row of the plurality of blocks may include T blocks, where T is any suitable positive integer greater than one. Although T=5 in the example arrangement 300, this is for illustrative purposes only and not by way of limitation, as each row of the plurality of blocks may have any suitable number of blocks (e.g., T may be at least two, between 2 and 10, 2, 3, 4, 6, 7, 8, 9, 10, 25, 50, 100, or any other suitable number of blocks, etc.).

In some embodiments, the rows of blocks of arrangement 300 are subdivided into groups of rows of blocks called epochs. Each epoch includes S rows of blocks, where S is any positive integer greater than one. Although S=3 in the example arrangement 300, this is for illustrative purposes only and not by way of limitation, as epochs may have any suitable number of rows of blocks (e.g., S may be at least two, between two and 10, 2, 4, 5, 6, 7, 8, 9, 10, etc.).

As shown in FIG. 3A, for example, arrangement 300 includes eight epochs each having three rows. The epochs are demarcated using bold horizontal lines. The eight epochs in FIG. 3A are labeled {e+1, e, e−1, e−1−Δ, e−2−Δ, e−3−Δ, e−4−Δ, e−5−Δ}. The epochs may be ordered in accordance with time in that epochs (of blocks) having a higher number in the ordering may be used to process (e.g., store and generate parity bits using) data bits obtained later than the data bits processed using epochs (of blocks) having a lower number in the ordering. For example, in the illustrative arrangement 300, epoch "e" may be used to process data bits received later than the data bits processed using epoch "e−1." Thus, in the example arrangement 300, time moves upwards. However, in other embodiments, the epochs may be organized such that time moves downwards, or the epochs may be mapped in any other way to time, as aspects of the technology described herein are not limited in this respect. Additionally, although the illustrated arrangement 300 includes eight epochs, this is not a limitation of aspects of the technology described herein, as an arrangement may include any suitable number of epochs. In particular, it should be appreciated that unlike "S" and "T", the number of epochs is not a design parameter (though the memory, such as memory 115, may be designed to store a fixed number of epochs), as epochs provide a convenient way of groupings bits. The longer an encoder runs, the more epochs there are.

Accordingly, each block in the arrangement 300 may be uniquely identified by a label specifying an epoch, a column of blocks within the epoch, and a row of blocks within the epoch. For example, block 301 may be uniquely identified by the label (e+1, 5, 3), which indicates that block 301 is in epoch "e+1", in the fifth column of epoch "e+1" and in the third row[1] of blocks of epoch "e+1".

[1] Since time flows upwards in example arrangement 300, the third row of blocks in an epoch is shown above the second row of blocks in the epoch, which is shown above the first row of blocks in the epoch.

As may be appreciated from the foregoing, arrangement 300 includes rows of blocks and rows of bits. Since each block (e.g., block 301) includes m rows of bits and each epoch has S rows of blocks, it follows that each epoch has Sm rows of bits. Similarly, since each block includes m columns of bits and each epoch has T columns of blocks, it follows that each epoch has Tm columns of bits. If E is total number of epochs in an arrangement, then the arrangement includes E×S×T× $m^2$ bits.

In some embodiments, the plurality of blocks in an arrangement is organized into multiple strands of blocks. The plurality of blocks in an arrangement may be organized into rows and columns of blocks and further organized into strands of blocks. As discussed in more detail below, such organization may be achieved by storing bits in a memory in according to one or multiple storage schemes, using one or more transformations, one or more indexing schemes, and/or in any other suitable way.

In some embodiments, each strand of blocks may include (e.g., consist of) 2T blocks. Each strand may include blocks from multiple epochs. In some embodiments, each strand may include blocks from T+1 epochs. A strand may have one or multiple blocks in a particular epoch. For example, a strand may have one block in one epoch and T blocks in another epoch. In embodiments where a strand includes blocks from T+1 epochs, the strand may have T blocks in one epoch and one block in each of the T other epochs.

In some embodiments, a strand of blocks may include two portions of blocks: a front portion of blocks and a back portion of blocks. The front portion of a strand of blocks may include the same number of blocks as the back portion of the strand of blocks. Accordingly, when a strand of blocks includes 2T blocks, the front portion of the strand and the back portion of the strand may each include T blocks. The front portion and the back portion of a strand may be disjoint and not share any blocks.

In some embodiments, the back portion of a strand of blocks may include (e.g., consist of) a row of blocks in an arrangement. In such embodiments, the back portion of the strand of blocks includes a row of T blocks. The front portion of a strand of blocks may include blocks from at least two different columns of blocks in at least two different rows of blocks other than the row of blocks in the back portion of the strand. In some embodiments, the front portion of a strand of blocks may include T blocks, with each of the T blocks being in a different column of blocks in the arrangement from the other blocks in the front portion of the strand. Each of the T blocks in the front portion of the strand may also be in a different row of blocks from the other blocks in the front portion of the strand. Each of the T blocks in the front portion of the strand may also be in a different epoch of blocks from the other blocks in the front portion of the strand.

Figure 3B:
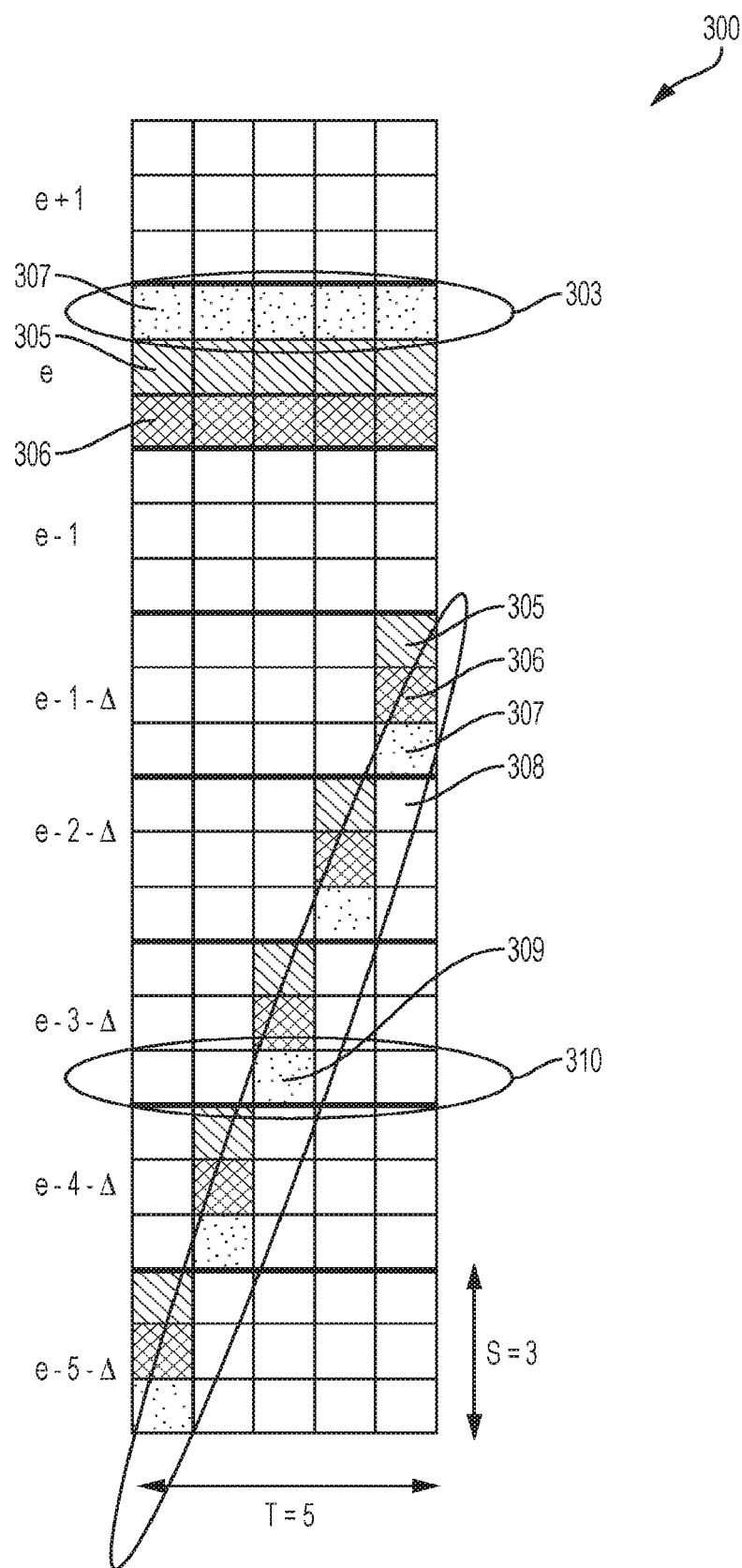

FIG. 3B illustrates how blocks in arrangement 300 may be organized into strands. FIG. 3B shows three strands of blocks in arrangement 300 using common shading: the blocks in strand 305 (all being shaded using left to right diagonal lines), the blocks in strand 306 (all being shaded using cross hatching), and the blocks in strand 307 (all being shaded using dots). The back portion of strand 305 consists of blocks in the middle row of blocks in epoch "e". The back portion of strand 306 consists of blocks in the bottom row of blocks in epoch "e." The back portion of strand 307 consists of blocks in the top row of blocks in epoch "e."

As shown in FIG. 3B, the front portion of strand 305 includes blocks in at least two different columns of blocks in at least two rows of blocks other than the row of blocks containing the back portion of strand 305 (i.e., other than the middle row of blocks in epoch "e"). The T blocks in the front portion of strand 305 are in T different columns of blocks, in T different rows of blocks, and in T different epochs. In particular, the T blocks of the front portion of strand 305 are the blocks associated with labels in the set of labels: {(e−1−Δ, 5, 3); (e−2−Δ, 4, 3); (e−3−Δ, 3, 3); (e−4−Δ, 2, 3); (e−5−Δ, 1, 3)}.

Similarly, the front portion of strand 306 includes blocks in at least two different columns of blocks in at least two rows of blocks other than the row of blocks containing the back portion of strand 306 (i.e., other than the bottom row of blocks in epoch "e"). The T blocks in the front portion of strand 306 are in T different columns of blocks, in T different rows of blocks, and in T different epochs. In particular, the T blocks of the front portion of strand 306 are the blocks associated with labels in the set of labels: {(e−1−Δ, 5, 2); (e−2−Δ, 4, 2); (e−3−Δ, 3, 2); (e−4−Δ, 2, 2); (e−5−Δ, 1, 2)}.

Similarly, the front portion of strand 307 includes blocks in at least two different columns of blocks in at least two rows of blocks other than the row of blocks containing the back portion of strand 307 (i.e., other than the top row of blocks in epoch "e"). The T blocks in the front portion of strand 307 are in T different columns of blocks, in T different rows of blocks, and in T different epochs. In particular, the T blocks of the front portion of strand 307 are the blocks associated with labels in the set of labels: {(e−1−Δ, 5, 1); (e−2−Δ, 4, 1); (e−3−Δ, 3, 1); (e−4−Δ, 2, 1); (e−5−∴, 1, 1)}. The back portion of strand 307 is further emphasized using ellipse 303. The front portion of strand 307 is further emphasized using ellipse 308.

In some embodiments, each strand may be uniquely identified by a label indicating an epoch e and a row of blocks s ($1 \leq s \leq S$) indicating the row of blocks within the epoch containing the back portion of the strand. For example, strands 305, 306, and 307 may be uniquely identified by labels (e,2), (e,1), and (e,3), respectively, which labels identify the locations of the back portions of the strands 305, 306, and 307.

In some embodiments, the back portion of a strand of blocks (e,s) contains the T blocks associated with labels in the set of labels {(e,1,s), (e,2,s), . . . , (e,T,s)}, where T is a positive integer greater than 1 that indicates the number of columns of blocks in the arrangement. The front portion of the strand of blocks (e,s) contains the T blocks associated with labels in the set of labels given by:

$$\{(e-\Delta-1,\kappa(1),\lambda(s)),(e-\Delta-2,\kappa(2),\lambda(s)), \ldots ,(e-\Delta-T,\kappa(T),\lambda(s))\}, \quad (1)$$

where $\Delta$ is a non-negative integer offset, $\lambda(\ )$ is a permutation of the integers $\{1, \ldots, S\}$ preferably having a single cycle of length S, and $\kappa(\ )$ is a permutation of the integers $\{1, \ldots, T\}$.

FIG. 3B shows three strands 305, 306, 307, whose front portions may be obtained in the case where, within Equation (1), the offset $\Delta=1$, the permutation $\kappa(t)=T+1-t$, and the permutation $\lambda(v)=1+(v \bmod S)$. As may be appreciated, front portions of blocks may be organized within the arrangement differently depending on the specific choices made for the offset $\Delta$, the permutation $\kappa$, and the permutation $\lambda$.

In some embodiments, each block of bits in the arrangement is part of exactly two strands of blocks. Each block may be part of a front portion of one strand of blocks and part of a back portion of another strand of blocks. For example, a block associated with a label of (e, h, s) may be part of the back portion of strand (e, s) and may also be part of the front portion of strand $(e+\Delta+\kappa^{-1}(h), \lambda^{-1}(s))$, where the superscript$^{-1}$ denotes the inverse of a function. For instance, as illustrated in FIG. 3B, block 309 associated with label (e−3−Δ, 3, 1) belong to the front portion of strand 307 (associated with label (e,3)) and to the back portion 310 of strand (e−3−Δ, 1). Thus, block 309 is part of exactly two strands of blocks in arrangement 300.

Figure 3C:
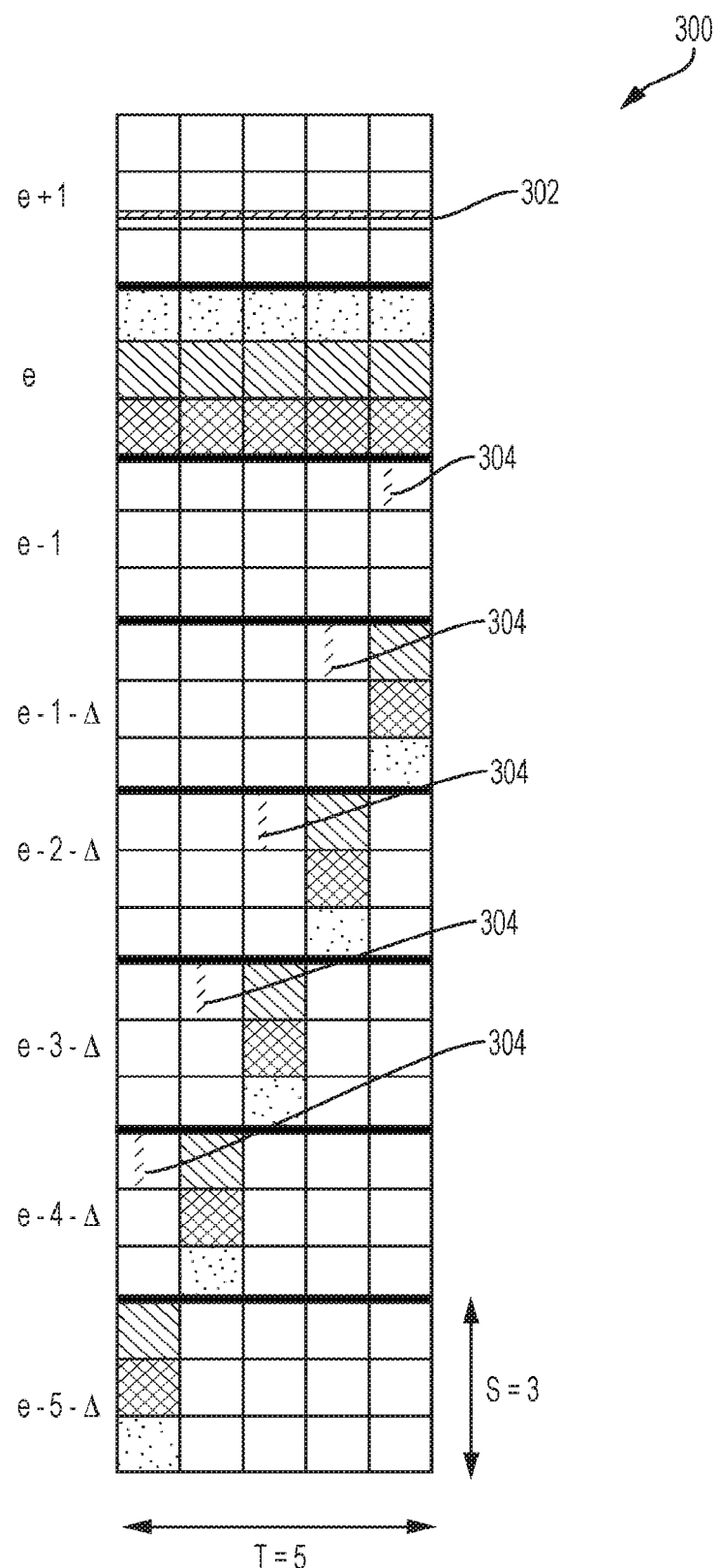
Figure 3D:
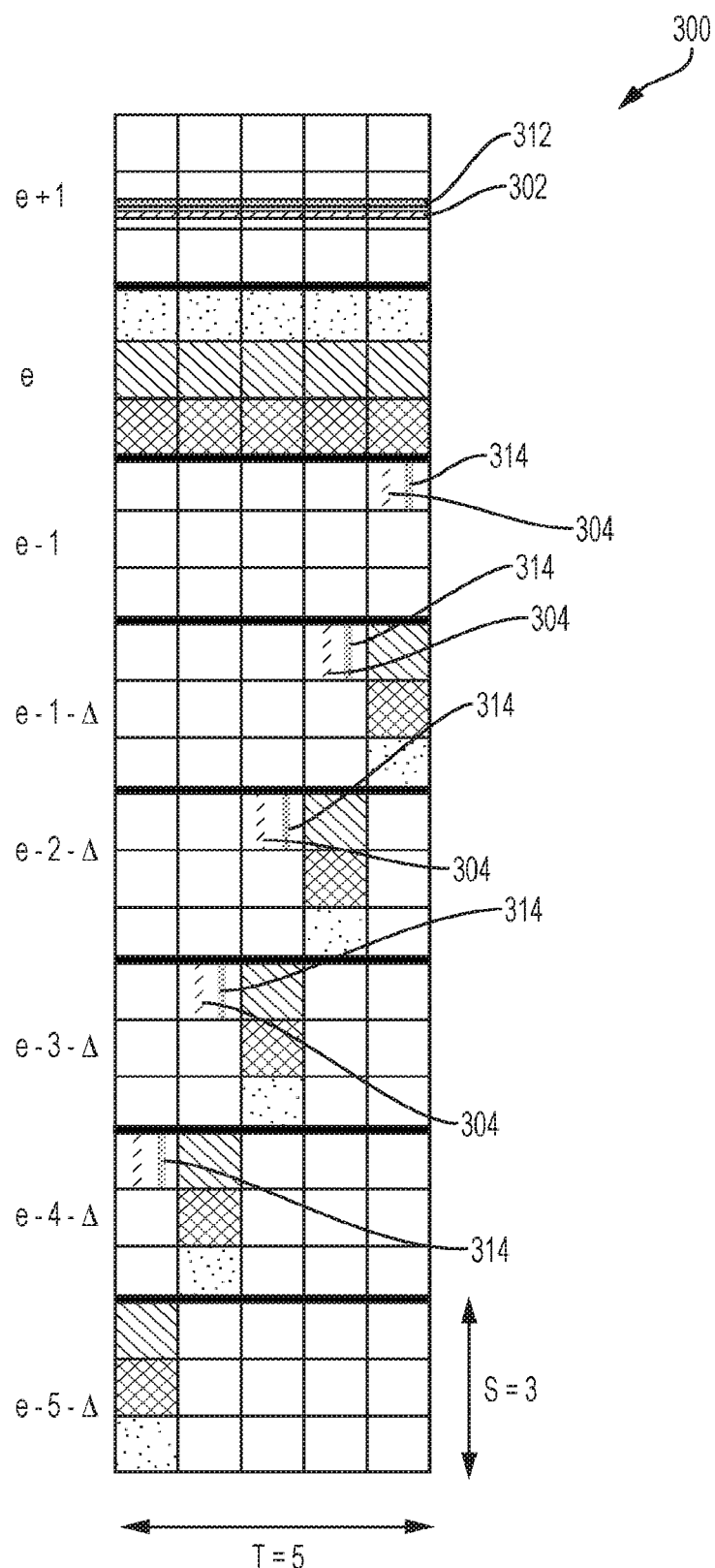

In some embodiments, each strand may include multiple lines of bits. Each line of bits may include a row of bits and multiple columns of bits associated with the row of bits. Each line of hits may include a row of hits extended across all blocks in the hack portion of the strand and associated columns of bits in the front portion of the strand. Since the back portion of a strand includes m rows of bits, a strand includes m different lines of bits—one line of bits for each row of bits in the back portion and its associated columns in the front portion. A line of bits including the kth row of bits in the back portion of the strand (where $1 \leq k \leq m$) may also include the kth column of bits in each of the blocks in the front portion of the strand. Each line of bits therefore includes 2Tm bits, with Tm bits being in a row of bits in the back portion of the strand and Tm other bits being in columns in the front portion of the strand, which are associated with the row of bits. FIG. 3C shows an illustrative example of a line of bits in arrangement 300. The line of hits includes row 302 and the columns 304, which correspond to row 302 as shown by a common shading. FIG. 3D additionally shows another line of bits in arrangement 300, which line includes row 312 and the columns 314, which correspond to row 312 as shown by a common shading.

It should be appreciated that an arrangement may have any suitable number of strands. In some embodiments, an arrangement may include S strands of blocks for each epoch in the arrangement.

Next, we discuss how data bits stored in an arrangement, such as arrangement 300, may be encoded using one or more base error correcting codes. The structure of the strands guides the way in which data bits stored in the arrangement are used to generate parity bits.

In some embodiments, encoding data bits stored in an arrangement (e.g., arrangement 300) may be performed by encoding data bits in each of the strands of blocks. Within each strand of blocks, data bits in a line of bits may be encoded by generating parity bits from the data bits. For example, in some embodiments, encoding data bits in a strand of blocks may include: (1) accessing data bits in a line of bits in the strand (e.g., by accessing a row of bits in the back portion of the strand and corresponding columns in the front portion of the strand); (2) generating parity bits based on the accessed line of data bits using a base error correcting code associated with the accessed line; and (3) storing the generated parity bits within the line of bits in the back portion of the strand (i.e., within the row of bits that are part of the line of bits).

FIG. 3C provides an illustrative example of this encoding scheme. Encoding data bits in a strand of blocks (e+1, 2) having a back portion in the middle row in epoch e+1 may include: (1) accessing a line of data bits in the strand including data bits in row 302 and data bits in columns 304; (2) generating parity bits based on the accessed line of data bits using a base error correcting code associated with the accessed line of bits; and (3) storing the generated parity bits within row 302.

In some embodiments, encoding data bits in a strand of blocks may include encoding data bits in each of multiple lines in the strand. For example, as illustrated in FIG. 3D, the strand of blocks (e+1, 2) contains multiple lines of bits including a first line of bits, which first line includes bits in row 302 and columns 304 associated with row 302, and a second line of bits, which second line includes bits in row 312 and columns 314 associated with row 312. Accordingly, encoding data bits in the strand (e+1, 2) involves encoding data bits in the first line (as described above) and further performing: (1) accessing the second line of data bits in the strand including data bits in row 312 and data bits in columns 314; (2) generating parity bits based on the bits in the second line using a base error correcting code associated with the second line of bits; and (3) storing the generated parity bits within row 312.

The parity bits may be generated from data bits in a line of a strand using any suitable base error correcting code. In some embodiments, the base error correcting code may be any suitable linear (n, k) block code with parity check matrix H. The linear block code may have minimum distance $d_{min}$. For example, in some embodiments, the base error correcting code may be a cyclic error correcting code such as, for example, a BCH code.

In some embodiments, a linear (n,k) block code with n=2T m may be used, where T is the number of columns of m×m blocks in an arrangement. If this constraint cannot be met, or if using such a constraint results in a transmitted code rate that higher than the desired code rite, a suitable number of bits can be left "empty" or "shortened" (i.e., not transmitted over the channel and either not taken into account by the encoder and decoder, or taken to be ( )). Accordingly, in some embodiments, the base error correcting code may be a shortened cyclic error code such as, for example, a shortened BCH code.

It should be appreciated that a line of bits in a strand may include data bits and parity bits. For example, a line of bits may include n=2Tm total bits of which 2Tm−p bits are data bits (e.g., bits received over input interface 111) and p bits are parity bits computed by applying an error correcting code to the 2Tm bits. Accordingly, in some embodiments, encoding a line of data bits comprises: (1) accessing n/2=Tm data bits from the front portion of the line (i.e., the bits in the line appearing as columns in the front of the strand containing the line); (2) accessing n/2-p data hits from the hack portion of the line (i.e., the hits in a row of the hack portion of the strand containing the line); (3) constructing a vector x having 2Tm bits of which 2Tm−p are the accessed data bits and p bits are left undetermined; (4) determining the p parity bits by applying a parity check matrix H of the error correcting code associated with the line to the 2Tm−p data bits; and (5) storing the determined p parity bits in the back portion of the line (into the undetermined spots and without overwriting the data bits in the back portion of the line). The rate of a poly-stranded code is given by (n−2p)/n.

It should be appreciated that, in some embodiments, the n/2-p bits accessed at step (2) of the above process may not actually be written into the arrangement prior to the computation of the parity bits and may be taken from an input stream of data hits. In such embodiments, Tm bits are accessed from the front portion of the line, Tm−p bits are accessed from an input stream of bits, and the back portion of the line may be filled with the n/2-p data bits and the p parity bits together once the parity bits have been computed using an appropriate error correcting code. In such embodiments, the arrangement may be filled in with data with one or multiple rows of bits at a time.

As a specific example, using the notation developed above, an rth line in strand (e, s) may be encoded by: (1) accessing n/2=Tm data bits from the front portion of the line (i.e., bits from the rth columns of bits in blocks associated with labels in the set of labels $\{(e-\Delta-1, \kappa(1), \lambda(s)), (e-\Delta-2, \kappa(2), \lambda(s)), (e-\Delta-T, \kappa(T), \lambda(s))\}$; (2) accessing 2TM-p bits from the back portion of the line; (3) constructing a vector x having 2Tm bits of which 2Tm−p are the accessed data bits and p bits are left undetermined; (4) determining the p parity bits by solving the equation $x\pi_{rs}H=0$, where H is a parity check matrix associated with a linear block code and a $\pi_{rs}$ is a permutation of the rows of H (such permutations are discussed in more detail below); and (5) storing the determined p parity bits in the back portion of the line (into the undetermined spots and without overwriting the data bits in the back portion of the line). This process may be repeated iteratively over epochs and in any order, over strands (1, . . . , S) and strand lines/rows (r=1, . . . , m).

It should be appreciated, however, that the encoding of data ending at epoch e−1−Δ must complete before the encoding of data in epoch e begins (since parity bits computed in epoch e−1−Δ are used to generate parity bits in epoch e because they appear in the front portions of the strands whose back portions are in epoch e), and a similar processing latency issue occurs in the decoder. The constant Δ may be chosen as large as needed to solve processing latency issues. Although, in some embodiments Δ is an integer, so that the blocks in the front of a strand are offset by at least an integer number of epochs from the blocks in the back of the strands, in other embodiments Δ may take on a non-integer value (e.g., 1.5) so as to provide a finer amount of control for the processing latency. In such embodiments, the front blocks of a strand may be offset vertically by an arbitrary number of blocks. The notation developed so far may be generalized to handle non-integer values of Δ.

Figure 3E:
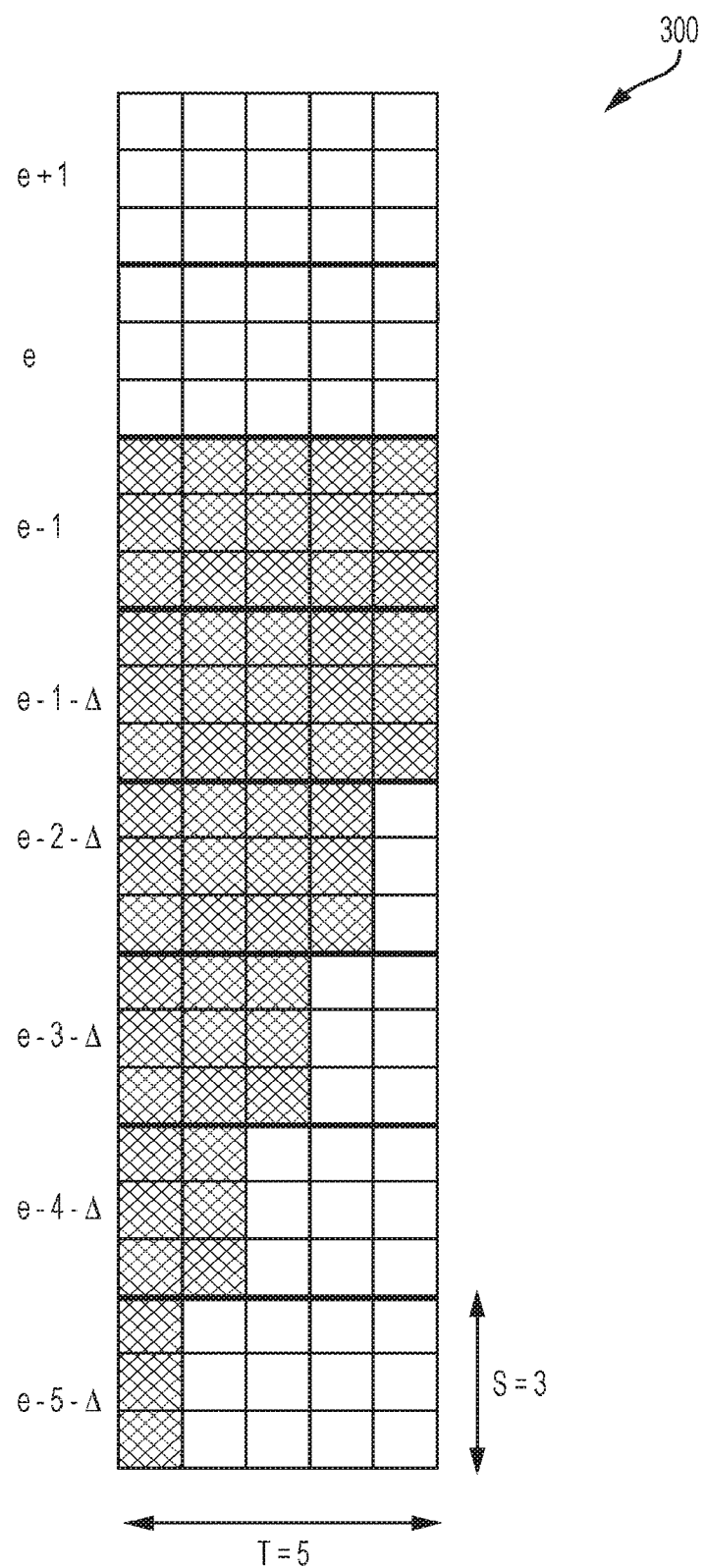
FIG. 3E is a diagram illustrating a state of an encoder for a poly-stranded code, in accordance with some embodiments of the technology described herein.

As may be appreciated from the foregoing description of the encoding scheme, the encoder state of the poly-stranded code (e.g., the set of bits that stored and used for the encoding of future bits) may consists of S (ΔT+T (T+1)/2) blocks each having $m^2$ bits, or 0.25 S (A/T+(1+1/T)) $n^2$ hits. FIG. 3E illustrates the state of the encoder at epoch e, which consists of the 60 shaded blocks in epochs e−5−Δ to e−1. Accordingly, the growth of the size of the encoder is quadratic in n (number of bits in a line) and is linear in S (the number of strands in an epoch). As shown in FIG. 3E, during the processing of data bits in epoch e, the bits in the rightmost shaded columns of blocks in epochs e−1−Δ to e−5−Δ are used. After the processing of bits in the 15 blocks of epoch e is completed, the data and parity bits in the 15 blocks of epoch e are stored in memory, while the 15 rightmost shaded blocks in epochs e−1−Δ to e−5−Δ need not be stored for further processing. As such, they may be over-written in memory.

In some embodiments, an encoder for a poly-stranded code may be configured to handle codes having several rates. Lower rate codes can be obtained by shortening the base code of a higher rate code. Since, for a given number of strands, the size of the memory used by an encoder is quadratic in the code length, a lower rate code may use more strands than the higher rate code, without requiring additional memory. Using more strands increases performance as more base codes are coupled, but does not require performing additional computations per bit.

Since each line in a strand is associated with a respective base error correcting code, each strand (e,s) is associated with m base error correcting codes (which may be the same or different codes). Thus, a base code may be identified by a triple [e,s,r], r=1, . . . m. Note that triples identifying codes are delimited by square brackets, while triples identifying blocks are delimited by parentheses. In the next paragraph we assume all base codes are linear codes with minimum distance $d_{min}$.

When a 1 bit occurs in a linear base code [e,s,r], there must be $d_{min}$ 1 bits, spread over the front and the back. The qth 1 back bit (if any) of [e,s,r] is also a front bit in an intersecting code of strand ($e_q$, $\lambda^{-1}(s)$) with $c_q$>c and there must be $d_{min}$ 1 bits in that code. The qth 1 front hit (if any) of [e,s,r] is also a hack hit in an intersecting code of strand ($e_q$, $\lambda(s)$) with $e_q$<e and there must be $d_{min}$ 1 bits in that code. No two of the $d_{min}$ such intersecting codes can overlap. That is because either they are codes in the same strand and are then parallel by construction, or they are codes in two different strands. Two strands can only overlap if the front of the later one crosses the back of the earlier one in some block. But, as discussed above, a block is always part of exactly two strands, in the back of a strand with epoch row w and in front of a strand with epoch row $\lambda^{-1}(w)$. The pair (w, $\lambda^{-1}(w)$) cannot match a pair of the form ($\lambda(s)$, $\lambda^{-1}(s)$), as identified above if the permutation $\lambda$ has no fixed point. We can thus conclude that the minimum weight of a non-zero poly-stranded code codeword can be at least $d^2_{min}$, which ensures that the resulting poly-stranded code has at least the minimum Hamming distance of a Product Code based on the same base code.

In some embodiments, a poly-stranded code may be based on an extended BCH code with n=256, p=17, k=n−p=239, and $d_{min}$=6. The rate of such a poly-stranded code is 222/256=0.867 and its $d_{min}$ is greater than or equal to 36. The block size may be m=16 or m=32, both of which divide n/2=128 and can be handled by current memory technology. The number of blocks in a row of blocks in an arrangement may be T=8, when m=16, and T=4, when m=32. The number of strands S may be determined by the required processing speed (in terms of the number of rows encoded per second per processing element) and the throughput requirement (in bits per seconds), which together determine the required amount of parallelism. For example, using S=2 strands would require keeping approximately $256^2$ bits in memory as the state of the encoder, whereas using S=4 strands, which would require keeping twice as any bits than that in memory as the state of the encoder.

In some embodiments, a shortened version of the above described may be used, such that n=192, n−p=k=175. The rate of this shortened code would be 158/192=0.823. The block size may be m=16 or m=32. The number of blocks in a row of blocks in an arrangement may be T=6, when m=16, and T=3, when m=32. If the number of strands S having their back portions in a single epoch is S=2, then the encoder state size will be about $192^2$ bits. Thus, S may be increased from 2 to 3 for m=16, or from 4 to 7 for m=32, without increasing the amount of memory needed to store the state of the encoder. It should be appreciated that the same processing blocks may be used to process the original and the shortened poly-stranded codes, the main difference being in determining which blocks to read from or write to memory during a processing cycle.

In some embodiments, different lines of a same strand may be encoded using different base error correcting codes, sharing the same length n. Thus, different rows of bits in the same strand may be encoded using different base error correcting codes, in some embodiments. For example, one line of bits in a strand may be encoded using a linear block code with parity check matrix H and another line of bits in the strand may be encoded using another linear block code having parity matrix G obtained as a permutation of rows in matrix H. As another example, all lines of bits in a strand may be encoded using different base error correcting codes, which may be obtained by applying different permutations to a parity check matrix of some initial linear block code or in any other suitable way (i.e., the different base error correcting codes need not be derived from a common initial parity check matrix). Thus, it should be appreciated that data bits in any set of one or more lines (whether within a strand or across different strands, whether within an epoch or across multiple epochs) may be encoded by using a respective base error correcting code. As such any two lines in an arrangement may be encoded using the same base error correcting code or different base error correcting codes.

Accordingly, in some embodiments, data hits may be organized into an arrangement having a plurality of rows of bits including a first row of bits and a second row of bits (e.g., two rows of bits in a same epoch, two rows of bits in a same strand, etc.) and at least some of the data bits may be encoded by using a first error correcting code (e.g., a linear block code with parity check matrix H) to generate first parity bits using data bits in the first row of bits and a second error correcting code different from the first error correcting code (e.g., a linear block code with parity matrix $\pi$H, where $\pi$ is a row permutation of H) to generate second parity bits using the data bits in the second row of bits. Thus, the first parity bits may be generated independently from the second parity bits and the data bits used in generating the first parity bits for the first row of bits may not be used in generating the second parity bits for the second row of bits.

As described above, in some embodiments, different lines of bits in an arrangement may be encoded using different row permutations of a parity check matrix H associated with some linear block code. For example, a line of strand s that contains the row of bits r in its front portion may be encoded by generating parity bits using the parity check matrix $\pi_{s,r}$ H, where $\pi_{s,r}$ denotes a row permutation of the parity check matrix H.

As suggested by the notation, different row permutations can be used for different strands and rows within a strand. However, in some embodiments, the implementation of the poly-stranded code may be simplified if the permutations used have one or both of the following two properties: (1) the permutations do not depend on strand s and depend only on the row r such that the qth row in one strand is encoded using the same base error correcting code as the qth row in another strand (with q between 0 and m−1); and (2) they block-permute the parity check matrix. In some embodiments, a permutation $\pi_{sr}$ that block-permutes a parity check matrix H permutes entries in the matrix such that the permuted position $p_{sr}(t)$ of row t of H by $\pi_{sr}$ has the property that (with t between 0 and n−1)

$$p_{sr}(t)=m\lfloor t/m \rfloor+\mathrm{mod}(p_{sr}(t \bmod m),m),$$

where [x] denotes the floor of x.

When m is a power of two, the function $p_{sr}(t)=\mathrm{XOR}(t,r)$ has both of the above properties. Here, XOR(a,b) denotes a number whose binary representation is the bitwise exclusive or of the binary representation of a and the binary representation of b. This type of permutation may be implemented very efficiently within the processing circuitry that operates on blocks. When such a permutation is applied to a parity check matrix of a BCH(256,239) code with block size of 16×16 bits, the resulting poly-stranded code has a minimum Hamming distance greater than $d^2_{min}$, which ensures that the resulting poly-stranded code has better performance than a product code using the BCH(256,239) code as a base error correcting code.

The structure of the arrangement used by a poly-stranded code (e.g., arrangement 300) facilitates efficient and parallel implementation of encoding and decoding. For example, when encoding or decoding a base code, computations can take place in parallel for the front and back portions of a strand. In some embodiments, front processing circuitry and back processing circuitry, each capable of processing m base code words in parallel, may be applied to processing blocks in the back of a strand concurrently with processing blocks in the front of a strand. As another example, data bits in different strands in an epoch may be encoded and decoded concurrently (e.g., at least partially or fully in parallel). As yet another example, data bits in different rows of bits in an epoch may be encoded and decoded concurrently. Accordingly, parallel processing may be used to process the data more efficiently depending on the throughput requirements. However, in some embodiments, data may be processed serially, as aspects of the technology described herein is not limited in this respect.

In some embodiments, arrangement 300 may be stored in a memory (e.g., memory 115 described with reference of FIG. 1B) as a two-dimensional array. In other embodiments, arrangement 300 may be stored in a memory in a way that may be mapped to a two-dimensional array through one or more transformations and/or indexing schemes and the transformation(s) and/or indexing scheme(s) may be used to write bits to the arrangement 300 or read bits from the arrangement 300. For example, in some embodiments, arrangement 300 may be stored in a memory in a way that facilitates the accessing (e.g., reading and/or writing) of bits in one or more epochs, one or more strands, and/or one or more lines.

In some embodiments, arrangement 300 may be stored in a memory in a cyclical manner such that data bits associated with a particular epoch are stored at memory locations associated with a prior epoch. For example, with reference to FIG. 3D, data and parity bits associated with epoch e+2 (not shown in FIG. 3D), which follows epoch e+1, may be stored at memory locations at which data and parity bits associated with epoch e−5−Δ were stored.

Though it should be appreciated that arrangement 300 may be stored in a memory in any suitable way to facilitate implementation of forward error correction (e.g., using multiple arrays, lists, any other suitable data structure(s), transformations, and/or indexing schemes).

Figure 4:
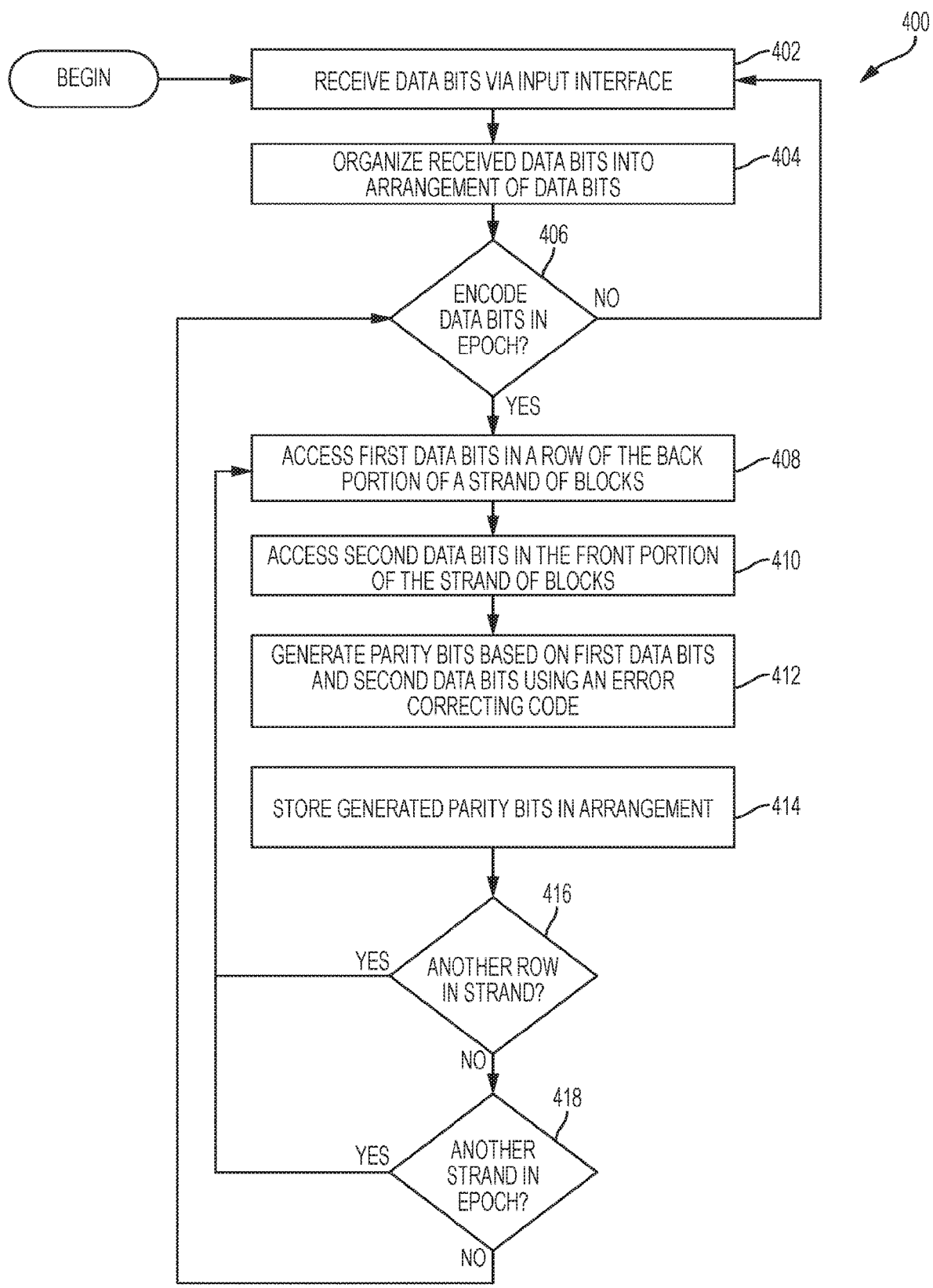
FIG. 4 is a flowchart of an illustrative process for encoding data bits using a poly-stranded code, in accordance with some embodiments of the technology described herein.

FIG. 4 is a flowchart of an illustrative process 400 for encoding data bits using a poly-stranded code, in accordance with some embodiments of the technology described herein. Process 400 may be performed by any suitable device and, for example, may be performed by transmitter 104 described with reference to FIGS. 1A and 1B.

Process 400 begins at act 402, where data bits are received via an input interface such as, for example, input interface 111 described with reference to FIG. 1B. Any suitable amount of data bits may be received at act 402, as aspects of the technology described herein are not limited in this respect. The data bits may be provided for encoding prior to subsequent transmission over an optical communication channel or any other suitable communication channel. In some embodiments, a poly-stranded code may be used to encode Sm data rows in parallel, whereas braided codes can encode only one data row in parallel. Accordingly, a poly-stranded code may be used to encode Sm more data bits per a period of time than a braided code.

Next, process 400 proceeds to act 404, where the data bits are organized in an arrangement of data bits. The arrangement of data bits may be the type of arrangement described above with reference to FIGS. 3A-3D such as, for example, arrangement 300. As described herein, such an arrangement may have a plurality of square blocks of bits and organized into rows and columns of blocks and further organized into strands of blocks. Each of the blocks may be a m×m square block of bits. The rows of blocks may be organized into epochs. Each of the strands of blocks may include a front portion of blocks and a back portion of blocks. Aspects of such arrangements have been described above.

In some embodiments, organizing the received data bits into the arrangement may comprise writing the received data bits into one or more memories storing the arrangement (e.g., memory 115). For example, organizing the received data bits into the arrangement may comprise writing the received data bits into one or more rows of the arrangement (e.g., by writing the received data bits into portions of memory in which rows of the arrangement are stored).

In some embodiments, writing data bits into a row of bits in an arrangement, at act 404, may comprise writing data bits into a portion of the row and not writing data bits into the rest of the row. For example, a row of bits in an arrangement may be configured to hold Tm bits (e.g., where T is the number of columns of m×m blocks in the arrangement) and writing data bits into the row at act 404 may comprise writing Tm−p bits into the row. As described below, the remaining p "spots" in the row may be used to store the p parity bits generated by encoding the Tm−p data bits and Tm other bits using a base error correcting code.

Next, process 400 proceeds to decision block 406, where a determination is made as to whether to encode any data bits in an epoch of the arrangement. As described above, an epoch comprises a group of S rows of blocks in the arrangement. This determination may be made in any suitable way. For example, it may be determined to encode data bits in an epoch of the arrangement when at least a threshold number of data bits have been stored in the epoch. As another example, it may be determined to encode data bits in an epoch of the arrangement when data bits have been written to at least one, some, or all of the rows of bits in the epoch. For instance, it may be determined to encode data bits in an epoch of the arrangement when each of one or more rows (e.g., exactly one row, a threshold number of rows, all rows) of bits in the epoch includes Tm−p data bits. When it is determined to not encode data bits in the epoch, process 400 returns to act 402, where additional data bits may be received via the input interface.

On the other hand, when it is determined that data bits in an epoch are to be encoded, process 400 proceeds to acts 408-414 and decision blocks 416-418, where data bits in the epoch are encoded. At act 408, an encoder in the device executing process 400 (e.g., FEC encoder 114) accesses first data bits in a row of bits in a back portion of a strand of blocks in the current epoch. The accessed first data bits may comprise Tm−p data bits. For example, as shown in FIG. 3C, the encoder may access Tm−p bits in row of bits 302 in strand (c+1,2) at act 408. As another example, illustrated in FIG. 3D, the encoder may access Tm−p bits in row of bits 312 in strand (e+1,2) at act 408. Though, it should be appreciated that the encoder may access data bits in any suitable row of any suitable strand in the current epoch at act 408.

Next, at act 410, the encoder accesses, in the front portion of the same strand of blocks, second data bits corresponding to the first data bits. The accessed second data bits may comprise Tm bits. As discussed above, when the first data bits are accessed from an rth of row of bits in the back portion of a strand, the second data bits may be accessed from the rth columns in the blocks constituting the front portion of the strand. Details of which blocks are part of the front and back portions of a strand are described herein including with reference to FIGS. 3A-3D. As one example, with reference to FIG. 3C, when Tm−p first data bits are accessed from row 302 at act 408, the Tin second data bits may be accessed from columns 304 at act 410. As another example, with reference to FIG. 3D, when Tm−p first data bits are accessed from row 312 at act 408, the Tin second data bits may be accessed from columns 314 at act 410.

Next, process 400 proceeds to act 412, where parity bits are generated from the first data bits and the second data bits using a base error correcting code. In some embodiments, when the first data bits include Tm−p bits and the second data bits include Tm bits, the base error correcting code may be used to generate p parity bits in any of the ways described herein including, for example, by stacking the 2Tm−p bits into an 2Tm×1 vector x and solving for the undetermined p positions of x, by solving the equation)(RH=0, where H is a parity check matrix for the base error correcting code, and π is some permutation of the rows of H (which could be the identity permutation leaving all the rows in place).

Also, as discussed above, any suitable linear block code may be used to generate the parity bits, examples of which codes are provided herein. In some embodiments, each row of a strand may be associated with a respective base error correcting code and when the first data bits are accessed from a particular row of bits of a strand, a base error correcting code associated with that row of bits and strand may be used to generate the parity bits. Examples of different base error correcting codes that may be used for encoding different rows of bits in the arrangement are described above and include error correcting codes derived by permuting rows of a parity check matrix H (for some initial linear block code) using permutations that may depend on the row and/or the strand containing the row, as discussed above.

Next, process 400 proceeds to act 414, where the generated parity bits are stored in the row of bits in the arrangement from which the first data bits were accessed. At the end of act 412, the row from which the first data bits were accessed may include both data bits and parity bits and, for example, may include Tm−p data bits and p parity bits.

Next, process 400 proceeds to decision block 416, where it is determined whether to encode data bits in another row in the strand. It may be determined to encode data bits in another row in the strand when there are at least one or more rows in the strand containing data bits, but not parity bits. Though, this determination may be made in any other suitable way, as aspects of the technology described herein are not limited in this respect. When it is determined that data bits in another row in the strand are to be encoded, process 400 returns, via the YES branch, to act 408 to start encoding data bits in the other row.

On the other hand, when it is determined that there is no other row in the strand whose data bits are to be encoded, process 400 proceeds, via the NO branch, to decision block 418, where it is determined whether there is another strand in the current epoch having data bits to be encoded. It may be determined to encode data bits in another strand when there are at least one or more rows in another strand in the current epoch containing data bits, but not parity bits. Though, this determination may be made in any other suitable way, as aspects of the technology described herein are not limited in this respect. When it is determined that data bits in another strand are to be encoded, process 400 returns, via the YES branch, to act 408 to start encoding data bits in a row of the other strand.

On the other hand, when it is determined that there are no data bits in any other strand within the current epoch to encode, process 400 returns, via the NO branch, to decision block 406, where it is determined as to whether to encode any data bits in any other epoch of the arrangement. In this way, process 400 may iterate over epochs in an arrangement and may encode data bits in each epoch by iterating through all the strands and all the rows of each strand. Within an epochs, the rows of bits may be encoded in any suitable order, as aspects of the technology described herein are not limited in this respect.

It should be appreciated that process 400 is illustrative and that there are variations of process 400. For example, in the illustrated embodiment of FIG. 4, data bits are first written to a particular row of an arrangement at act 404, then accessed at act 408 and used to generate parity bits at act 412, which parity bits are written to the particular row at act 414. In other embodiments, a streaming approach may be adopted instead. In such an approach, the first data bits are used to generate the parity bits before the first data bits are written to the particular row and, after the parity hits are generated, the first data hits and parity hits are written to the particular row. For example, in some embodiments, the encoder performs processing to generate bits for the rth row of bits in strand s by: (1) obtaining the Tm−p data bits from the input interface but not yet storing these data bits in the rth row; (2) accessing Tm bits in the front portion of strand s (e.g., in the rth columns of the blocks in the front portion of strand s); (3) generating p parity bits from the 2Tm−p data bits using a base error correcting code for row r and strand s; and (4) storing, in the rth row, the Tm−p data bits received at the first step and the p parity bits generated at the third step.

It should be appreciated that process 400 is illustrative and that there are variations of process 400. For example, in some embodiments, act 408 may be performed in parallel with act 406, or even prior to act 406, as the bits used as part of act 408 are already stored in memory. As another example, in some embodiments, act 410 may be performed before or concurrently with either one or both of acts 406 and 408.

The various inventive concepts described herein may be embodied as one or more processes, of which examples have been provided. The acts performed as part of each process may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, and/or ordinary meanings of the defined terms.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

Use of ordinal terms such as "first," "second," "third," etc., in the claims to modify a claim element does not by itself connote any priority, precedence, or order of one claim element over another or the temporal order in which acts of a method are performed. Such terms are used merely as labels to distinguish one claim element having a certain name from another element having a same name (but for use of the ordinal term).

The phraseology and terminology used herein is for the purpose of description and should not be regarded as limiting. The use of "including," "comprising," "having," "containing", "involving", and variations thereof, is meant to encompass the items listed thereafter and additional items.

Having described several embodiments of the techniques described herein in detail, various modifications, and improvements will readily occur to those skilled in the art. Such modifications and improvements are intended to be within the spirit and scope of the disclosure. Accordingly, the foregoing description is by way of example only, and is not intended as limiting. The techniques are limited only as defined by the following claims and the equivalents thereto.

What is claimed is:

1. An apparatus for performing forward error correction of data to be transmitted over an optical communications channel, the apparatus comprising:
   an input interface;
   a preprocessor comprising circuitry coupled to the input interface and configured to:
      organize data bits received from the input interface into an arrangement having a plurality of blocks organized into rows and columns, the plurality of blocks further organized into a plurality of strands of blocks including a first strand of blocks, the first strand of blocks comprising:
         a back portion comprising a first row of the plurality of blocks, and
         a front portion comprising blocks from at least two different columns in at least two different rows other than the first row of blocks; and
   an encoder comprising circuitry configured to encode at least some of the data bits in the arrangement using a first error correcting code at least in part by:
      accessing first data bits in the front portion of the first strand of blocks;
      accessing second data bits in the back portion of the first strand of blocks; and
      generating first parity bits by applying the first error correcting code to the first data bits and the second data bits; wherein each of the plurality of blocks is an m by m block, wherein accessing the first data bits comprises accessing Tm data bits in the front portion of the first strand of blocks, wherein accessing the second data bits comprises accessing Tm−p data bits in the back portion of the first strand of blocks, wherein p is a positive integer, and wherein generating the first parity bits comprises generating p parity bits using the Tm data bits accessed in the front portion of the first strand of blocks and Tm−p data bits accessed in the back portion of the first strand of blocks.

2. The apparatus of claim 1, wherein the plurality of blocks is organized into a plurality of epochs, each of the plurality of epochs comprising S rows and T columns of blocks, wherein S and T are positive integers, wherein the back portion of the first strand is in epoch e, wherein e is a positive integer, and
   wherein accessing the first data bits in the front portion of the first strand comprises accessing a column of data from each block in a set of T blocks associated with a set of labels given by:

$$\{(e-\Delta-1,\kappa(1),\lambda(s)),(e-\Delta-2,\kappa(2),\lambda(s)),\ldots,(e-\Delta-T,\kappa(T),\lambda(s))\},$$

wherein $\Delta$ is a non-negative integer,
   wherein $\lambda(\ )$ is a permutation of the integers $1, \ldots, S$, and
   wherein $\kappa(\ )$ is a permutation of the integers $1, \ldots, T$.

3. The apparatus of claim 2, wherein accessing the second data bits in the back portion of the first strand comprises accessing data from at least some of the blocks in a set of T blocks associated with a set of labels given by: $\{(e,1,s), (e,2,s), \ldots, (e,T,s)\}$.

4. The apparatus of claim 1, wherein applying the first error correcting code to the first data bits and the second data bits is performed by using a binary parity check matrix associated with the first error correcting code.

5. The apparatus of claim 4, wherein applying the first error correcting code to the first data bits and the second data bits is performed by using a first permuted binary parity check matrix generated by permuting rows of the binary parity check matrix using a first permutation.

6. The apparatus of claim 5, wherein the plurality of strands includes a second strand, and wherein the encoder is configured to generate second parity bits using data bits in the second strand at least in part by using a second permuted binary parity check matrix generated by permuting rows of the binary parity check matrix using a second permutation different from the first permutation.

7. The apparatus of claim 1, further comprising a memory configured to store the arrangement.

8. The apparatus of claim 1, wherein each block in the plurality of blocks is in a front portion of one strand in the plurality of strands and is also in a back portion of another strand in the plurality of strands.

9. The apparatus of claim 8, wherein each block in the plurality of blocks is part of exactly two strands in the plurality of strands.

10. An apparatus for performing forward error correction of data to be transmitted over an optical communications channel, the apparatus comprising:

an input interface configured to receive the data to be transmitted over the optical communications channel;

a memory configured to store an arrangement of data bits, the arrangement having a plurality of blocks organized into rows and columns, the plurality of blocks further organized into a plurality of strands of blocks including a first strand of blocks, the first strand of blocks comprising:

a back portion comprising a first row of the plurality of blocks, and a front portion comprising blocks from at least two different columns in at least two different rows other than the first row of blocks; and an encoder comprising circuitry coupled to the input interface and configured to:

access first data bits in the front portion of the first strand of blocks;

obtain second data bits via the input interface;

encode the first data bits and the second data bits at least in part by generating first parity bits by applying a first error correcting code to the first data bits and the second data bits; and store the second data bits and the generated first parity in the back portion of the first strand; wherein the first error correcting code is a cyclic error correcting code or a shortened cyclic error correcting code.

11. The apparatus of claim 10, wherein applying the first error correcting code to the first data bits and the second data bits is performed by using a binary parity check matrix associated with the first error correcting code.

12. The apparatus of claim 11, wherein applying the first error correcting code to the first data bits and the second data bits is performed by using a first permuted binary parity check matrix generated by permuting rows of the binary parity check matrix using a first permutation.

13. The apparatus of claim 12, wherein the plurality of strands includes a second strand, and wherein the encoder is configured to generate second parity bits using data bits in the second strand at least in part by using a second permuted binary parity check matrix generated by permuting rows of the binary parity check matrix using a second permutation different from the first permutation.

14. The apparatus of claim 10, wherein the first error correcting code is a Bose, Chaudhuri, and Hocquenghem (BCH) code or a shortened BCH code.

15. The apparatus of claim 10, further configured to transmit the first data bits, the second data bits, and the first parity bits over the optical communications channel.

16. The apparatus of claim 10, wherein each block in the plurality of blocks is in a front portion of one strand in the plurality of strands and is also in a back portion of another strand in the plurality of strands.

17. The apparatus of claim 16, wherein each block in the plurality of blocks is part of exactly two strands in the plurality of strands.

* * * * *